United States Patent [19]
Derderian et al.

[11] Patent Number: 5,773,363
[45] Date of Patent: Jun. 30, 1998

[54] SEMICONDUCTOR PROCESSING METHOD OF MAKING ELECTRICAL CONTACT TO A NODE

[75] Inventors: Garo J. Derderian; Gurtej S. Sandhu, both of Boise, Id.

[73] Assignee: Micron Technology, Inc., Boise, Id.

[21] Appl. No.: 664,105

[22] Filed: Jun. 13, 1996

Related U.S. Application Data

[63] Continuation-in-part of Ser. No. 336,260, Nov. 8, 1994, Pat. No. 5,576,071, Ser. No. 506,040, Jul. 24, 1995, and Ser. No. 587,145, Jan. 16, 1996.

[51] Int. Cl.$^6$ .............................. H01L 21/70; B05D 3/06
[52] U.S. Cl. ...................... 438/672; 427/535; 427/255.2; 427/255.7
[58] Field of Search ................................ 427/535, 255, 427/255.1, 255.2, 255.7, 248.1; 438/672, 397

[56] References Cited

U.S. PATENT DOCUMENTS

| | | | |
|---|---|---|---|
| 4,977,440 | 12/1990 | Stevens et al. | 357/68 |
| 4,994,410 | 2/1991 | Sun et al. | 437/192 |
| 5,108,954 | 4/1992 | Sandhu et al. . | |
| 5,236,865 | 8/1993 | Sandhu et al. . | |
| 5,254,499 | 10/1993 | Sandhu et al. . | |
| 5,298,463 | 3/1994 | Sandhu et al. . | |
| 5,318,927 | 6/1994 | Sandhu et al. . | |
| 5,320,888 | 6/1994 | Sandhu et al. . | |
| 5,326,428 | 7/1994 | Farnsworth et al. . | |
| 5,356,835 | 10/1994 | Somekh et al. | 437/192 |
| 5,368,687 | 11/1994 | Sandhu et al. . | |
| 5,480,684 | 1/1996 | Sandhu . | |
| 5,514,908 | 5/1996 | Liao et al. | 257/751 |
| 5,523,697 | 6/1996 | Sandhu et al. . | |
| 5,533,924 | 7/1996 | Sandhu et al. . | |
| 5,567,483 | 10/1996 | Foster et al. | 427/535 |
| 5,571,572 | 11/1996 | Sandhu . | |
| 5,576,071 | 11/1996 | Sandhu . | |
| 5,610,099 | 3/1997 | Stevens et al. | 437/192 |
| 5,654,222 | 8/1997 | Sandhu et al. . | |
| 5,665,625 | 9/1997 | Sandhu et al. . | |

FOREIGN PATENT DOCUMENTS 5247781 1/1995 United Kingdom .

*Primary Examiner*—Roy V. King
*Attorney, Agent, or Firm*—Wells, St. John, Roberts, Gregory & Matkin, P.S.

[57] ABSTRACT

A semiconductor processing method of making electrical contact to a node includes, a) forming an insulating layer relative to a substrate having a node location to which electrical connection is to be made; b) forming a contact opening in the insulating layer to the node location; c) forming a layer of electrically conductive material to substantially fill the contact opening; the electrically conductive material being undesirably capable of absorbing oxygen, when exposed to an oxygen containing ambient, effective to render such material less electrically conductive; and d) providing the substrate with the layer of electrically conductive material within a reactor, and injecting a gas into the reactor and generating a plasma from the gas against the material, the exposure of the material to the plasma being effective to densify at least an outermost exposed portion of such material and render the layer of material less capable of absorbing oxygen when exposed to an oxygen containing ambient. Multiple such plasma treatments can be employed. The preferred electrically conductive material predominately comprises TiN. Such material as-deposited typically comprises carbon. The gas and plasma generated therefrom desirably have a component which is effective when in an activated state to interact with a component of the deposited conductive layer to remove carbon therefrom.

39 Claims, 4 Drawing Sheets

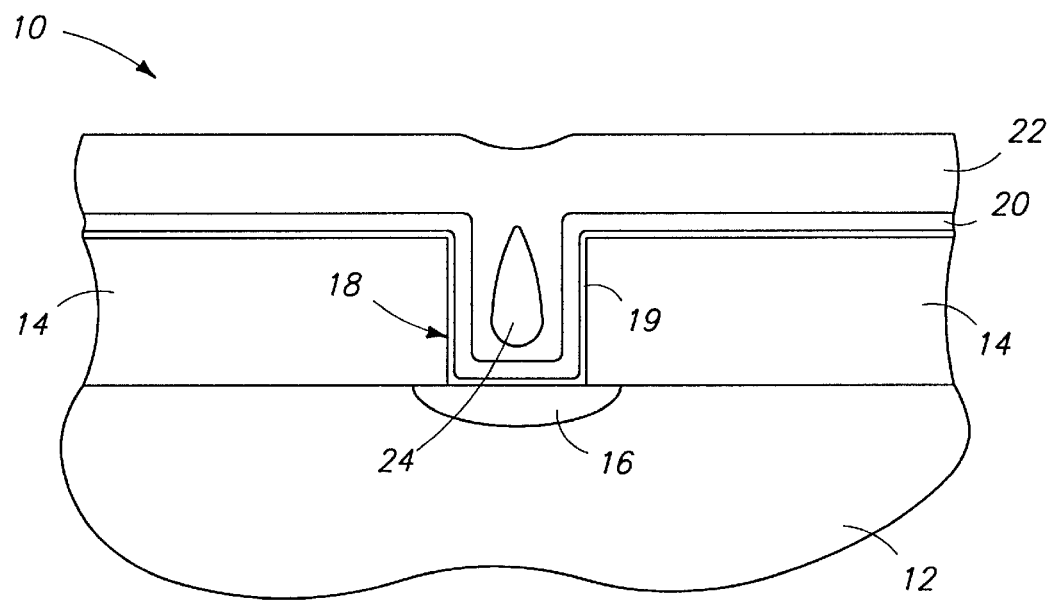
_Fig 1_
_PRIOR ART_
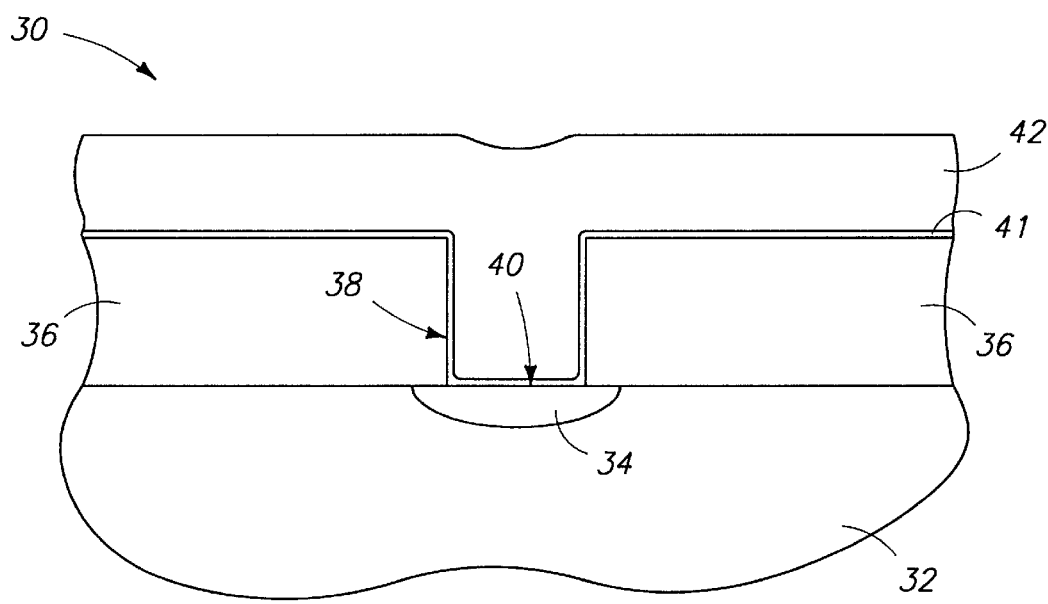
_Fig 2_

SEMICONDUCTOR PROCESSING METHOD OF MAKING ELECTRICAL CONTACT TO A NODE

RELATED PATENT DATA

This patent resulted from a continuation-in-part application of U.S. patent application Ser. No. 08/336,260, filed on Nov. 8, 1994, now U.S. Pat. No. 5,576,071 entitled, "Method Of Reducing Carbon Incorporation Into Films Produced By Chemical Vapor Deposition Involving Organic Precursor Compounds", listing Gurtej S. Sandhu as the inventor; U.S. patent application Ser. No. 08/506,040 filed on Jul. 24, 1995, entitled, "Method Of Reducing Carbon Incorporation Into Films Produced By Chemical Vapor Deposition Involving Organic Precursor Compounds", listing Gurtej S. Sandhu as the inventor; and U.S. patent application Ser. No. 08/587,145 filed on Jan. 16, 1996, entitled, "A Method Of Forming An Electrical Contact To A Silicon Substrate", listing Sujit Sharan and Gurtej S. Sandhu as inventors.

TECHNICAL FIELD

This invention relates to semiconductor processing methods of making electrical contact to a node.

BACKGROUND OF THE INVENTION

Advanced semiconductor fabrication is employing increasing vertical circuit integration as designers continue to strive for circuit density maximization. Such typically includes multi-level metallization. Electrical interconnect techniques typically require electrical connection between metal layers or other conductive layers which are present at different elevations in the substrate. Such interconnecting is typically conducted, in part, by etching a contact opening through insulating material to the lower elevation metal layer or conductive region. Increased circuit density has resulted in narrower and deeper electrical contact openings between layers within the substrate. Adequate contact coverage within these deep and narrow contacts continues to challenge the designer in assuring adequate electrical connection between different elevation areas within the substrate.

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductor runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive, doped or undoped $SiO_2$ layer.

Ultimately, an electrically conductive contact filling material such as tungsten or aluminum would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti in an Ar ambient and converting it to TiN in a separate plasma or thermal nitridation step; or e) by low pressure chemical vapor deposition.

As device dimensions continue to shrink, adequate step coverage within the contact has become problematical with respect to certain deposition techniques. Chemical vapor deposition is known to deposit highly conformal layers, and would be preferable for this reason in depositing into deep, narrow contacts.

Organic compounds are commonly utilized as chemical vapor deposition precursors. One subclass of this group which is finding increasing use in chemical vapor deposition of metals and metal compounds are organometallic precursors. Specifically, examples are the reaction of a titanium organometallic precursor of the formula $Ti(N(CH_3)_2)_4$, named tetrakisdimethyl-amidotitanium (TDMAT), according to the following formulas:

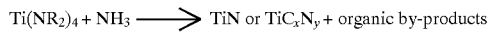

Organometallic compounds contain a central or linking atom or ion (Ti in TDMAT) combined by coordinate bonds with a definite number of surrounding ligands, groups or molecules, at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

The above and other chemical vapor deposition reactions involving organometallic are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity. Additionally, it is believed that organic incorporation (specifically pure carbon or hydrocarbon incorporation) into the resultant film reduces density and resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density and poor long-term reliability.

A typical prior art construction and method and problems associated therewith is apparent from FIG. 1. There illustrated is a semiconductor wafer fragment 10 comprised of a bulk substrate 12 and a overlying electrically insulative silicon dioxide layer 14, such as borophosphosilicate glass (BPSG). Bulk substrate 12 includes a dopant diffusion/active region 16 to which electrical connection is to be made. A contact opening 18 is provided through BPSG layer 14 to electrically conductive active area 16.

A thin titanium layer 19 for silicide formation with substrate 12 is provided. A thin layer 20 of titanium nitride is then deposited to within contact opening 18 to less than completely fill such opening. Titanium nitride layer 20 functions, at least in part, as an adhesion/nucleation layer for a subsequently deposited tungsten layer 22. Tungsten does not readily deposit over silicon dioxide, silicide or an exposed silicon substrate. Unfortunately, an undesired keyhole 24 typically forms leaving a void within contact opening 18. Subsequent planarize etching of layers 22 and 20 relative to insulating dielectric layer 14 can undesirably result in outward exposure or opening of such void.

Keyhole formation could substantially be avoided were contact opening 18 filled substantially entirely with titanium nitride, and a subsequently sputter deposited metal layer thereby not having to be utilized. However, titanium nitride has not heretofore been utilized to provide the substantial or predominate plugging material within a contact opening due to its inherent high diffusivity to oxygen upon mere exposure to an oxygen containing ambient. Oxygen incorporation into a titanium nitride film fundamentally lowers the film's conductivity. Further, less dense films typically contain more oxygen.

It would be desirable to overcome some of the above drawbacks in a manner which enables titanium nitride to be used as the predominate material which fills a contact opening for making electrical connection to a diffusion region in a semiconductive substrate. Although the invention arose in connection with formation of such contact plugs, the artisan will appreciate applicability of forming interlevel interconnects to other substrate constructions, such as between two elevationally separated conductive lines or layers. Further, the invention also primarily arose out of concerns and problems developed in chemical vapor deposition of titanium nitride layers utilizing organic precursor compounds. Yet again, the artisan will appreciate applicability of the invention to other electrically conductive materials which are undesirably capable of absorbing oxygen, when exposed to an oxygen containing ambient, effective to render such materials less electrically conductive.

BRIEF DESCRIPTION OF THE DRAWINGS

Preferred embodiments of the invention are described below with reference to the following accompanying drawings.

FIG. 1 is a diagrammatic sectional view of a prior art semiconductor wafer fragment, and is discussed in the "Background" section above.

FIG. 2 is a diagrammatic sectional view of a semiconductor wafer fragment at one processing step in accordance with the invention.

DETAILED DESCRIPTION OF THE PREFERRED EMBODIMENTS

Figure 3:
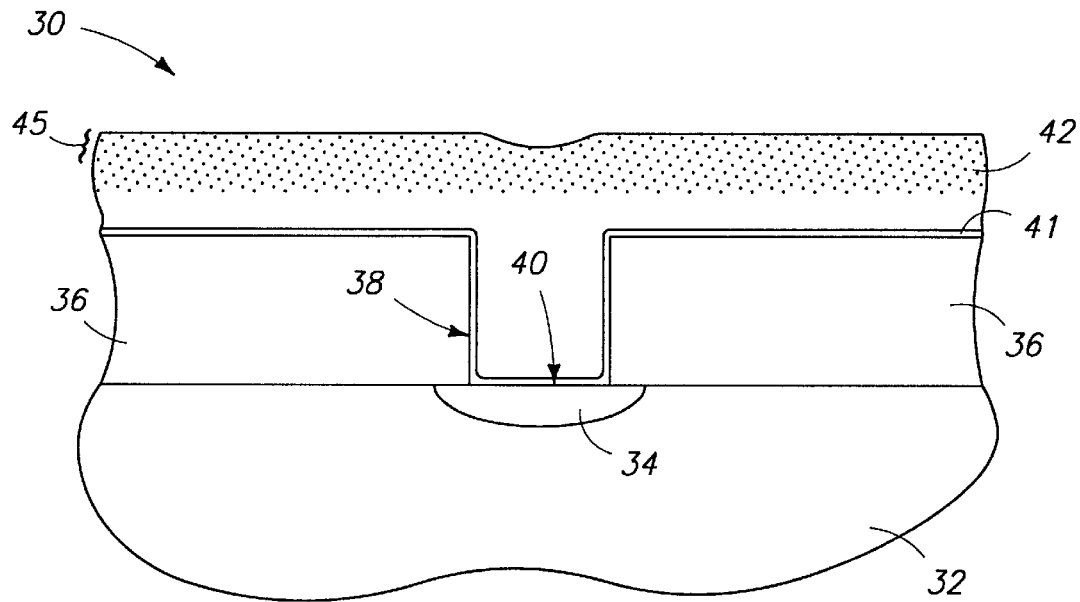
FIG. 3 is a view of the FIG. 2 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of making electrical contact to a node includes the following steps:

providing an insulating layer relative to a substrate having a node location to which electrical connection is to be made;

providing a contact opening in the insulating layer to the node location;

providing a layer of electrically conductive material to substantially fill the contact opening; the electrically conductive material being undesirably capable of absorbing oxygen, when exposed to an oxygen containing ambient, effective to render such material less electrically conductive; and providing the substrate with the provided layer of electrically conductive material within a reactor, and injecting a gas into the reactor and generating a plasma from the gas against the material, the exposure of the material to the plasma being effective to densify at least an outermost exposed portion of such material and render the layer of material less capable of absorbing oxygen when exposed to an oxygen containing ambient.

In accordance with another aspect of the invention, a semiconductor processing method of making electrical contact to a node includes the following steps:

providing an insulating layer relative to a substrate having a node location to which electrical connection is to be made;

providing a contact opening in the insulating layer to the node location;

depositing a layer of electrically conductive material over the insulating layer and to within the contact opening to substantially fill the contact opening; the electrically conductive material being undesirably capable of absorbing oxygen, when exposed to an oxygen containing ambient, effective to render such material less electrically conductive;

planarizing the conductive material layer to the insulating layer effective to define an isolated conductive plug of the conductive material within the contact opening; and providing the substrate with the isolated conductive plug within a reactor, and injecting a gas into the reactor and generating a plasma from the gas against an outermost exposed portion of the conductive plug, the exposure of the outermost portion of the plug to the plasma being effective to densify at least said outermost exposed portion of the plug and render the plug material less capable of absorbing oxygen when exposed to an oxygen containing ambient.

In accordance with still another aspect of the invention, a semiconductor processing method of making electrical contact to a node comprises:

providing a layer of electrically conductive material over a node location on a substrate; the electrically conductive material being undesirably capable of absorbing oxygen, when exposed to an oxygen containing ambient, effective to render such material less electrically conductive; and providing the substrate with the provided layer of electrically conductive material within a reactor, and injecting a gas into the reactor and generating a plasma from the gas against the material, the exposure of the material to the plasma being effective to densify at least an outermost exposed portion of such material and render the layer of material less capable of absorbing oxygen when exposed to an oxygen containing ambient.

More specifically and first with reference to FIGS. 2–5, a semiconductor wafer fragment in process is indicated generally with reference numeral 30. Such comprises a bulk monocrystalline silicon semiconductor substrate 32 having a diffusion region 34 provided therein. An insulating layer 36 is provided relative to substrate 32, with a contact opening 38 provided therein and therethrough to diffusion region 34. Again, the invention has applicability to other interlevel interconnections, with diffusion region 34 in a broader context constituting a node location relative to some substrate over which an insulating layer 36 is provided, and to which electrical connection is ultimately to be made.

A titanium layer 41 is preferably provided as shown. Subsequently a layer 42 of electrically conductive material is deposited over layer 41 and thereby over insulating layer 36 and to within contact opening 38 to substantially fill such opening. The preferred electrically conductive material for layer 42 is titanium nitride deposited by chemical vapor deposition employing an organometallic precursor compound, such as TDMAT. In a broader context of the invention, layer 42 will constitute some one or more electrically conductive materials which is undesirably capable of absorbing oxygen, when exposed to an oxygen containing ambient, effective to render such material(s) less electrically conductive. Examples of other such materials include Al, Ti, W, Cu and TiC.

In some instances, carbon from the organic precursor combines with the titanium to form TiC or $TiC_xN_y$, as opposed to pure TiN. While the resultant film will still predominately comprise TiN, 20 molar percent or greater TiC can be formed within the film. Since TiC can also function as an effective conductive barrier layer, this will typically be acceptable. However undesirably, hydrocarbon products from the precursor typically become incorporated in the film, further adversely effective conductivity. Further, subsequent exposure of layer 42 to an oxygen containing ambient undesirably results in oxygen incorporation, further lowering conductivity. In the first described FIGS. 2–5 embodiment, electrically conductive material layer 42 is deposited to a thickness effective to both completely fill contact opening 38 and to a thickness above electrical insulating layer 36 which will be effective for resultant patterning of a conductive line, as will be described subsequently.

Referring to FIG. 3, substrate 30 having deposited layer 42 is provided within a suitable reactor. The same or different reactor can be utilized from which layer 42 is provided, and with or without intervening exposure to an oxygen containing ambient. Preferably, no oxygen exposure of layer 42 occurs between its deposition and subsequent treatment. A suitable gas is injected into the reactor and a first plasma from the gas is generated against the material of layer 42. The exposure of the material of layer 42 to this first plasma treatment is conducted to be effective to densify at least an outermost exposed portion 45 of such material to effectively render layer 42 less capable of absorbing oxygen when exposed to an oxygen containing ambient. The substrate can be biased with a negative voltage (i.e., −100 volts) during the plasma treatment to attract ions against the substrate, if desired.

An example reduction-to-practice plasma density of $10^8$ to $10^9$ ions/cm$^3$ was utilized. High density plasma (i.e., $10^{12}$ to $10^{13}$ ions/cm$^3$) may also be employed to obtain a higher density of ions at lower process pressures. Example plasma conditions include., 350° C.–500° C. and 0.5–5.0 Torr, with an example power ranging from 50 watts to 500 watts. Example gases injected into the reactor include $N_2$, $NH_3$, Ar, $H_2$ and mixtures thereof. An example treatment time will range from 30–90 seconds.

Typically, such treatment may not be effective to completely densify the titanium nitride layer, but rather only an outer exposed region 45 of from an example 50 Angstroms to an example 500 Angstroms of such material. Density increase in such region is expected to range from 10% to 50% of the original as-deposited density.

In the most preferred embodiment, where the as-deposited layer undesirably comprises carbon, a gas and first plasma generated therefrom has a component which is effective when in an activated state to interact with a component of the deposited conductive layer to remove (at least some if not most all) carbon therefrom. In one preferred embodiment, this activated state component effectively diffuses into the first layer and interacts with the deposited first layer component to remove carbon therefrom, and produce gaseous products which are expelled from the reactor. Carbon incorporation in the resultant film is thus minimized. For example, the component of the deposited conductive layer might comprise unbonded and incomplete electron shell carbon atoms. The activated state component in this example would chemically react with the unbonded and incomplete electron shell atoms to drive carbon from the film.

For example, the injected gas might consist essentially of $N_2$. If the deposited film comprises hydrocarbons and also perhaps graphite carbon where the desired composition is TiN, the nitrogen plasma presents a component (atom or ionic nitrogen) against the deposited film. This component is chemically reactive with a component of the deposited film (carbon in this example) to remove or displace carbon from such film, and produce gaseous products (i.e., CN compounds) which are expelled from the reactor. The goal or intent with this example is to provide a gas which has some chemically reactive component which breaks a bond within the deposited film to cause carbon (in any of atomic, radical, or molecular form) to be displaced from the film and out of the reactor. The component from the gas might remain in the deposited film, combine with the displaced carbon and exit the reactor, or singularly exit the reactor without combining with carbon or other material of the deposited film. The gas from which the plasma is generated might contain one or more materials.

In the above nitrogen example, atomic N functions as a non-metallic bonding component to the metallic Ti, and results in conductive TiN. As another alternative, the component gas might consist of essentially of hydrogen or a combination of two or more reactive components. $NH_3$ is an example of a single component and chemically reactive gas which can present multiple components (N atoms and H atoms) which are separately reactive with components of the example TiN deposited films. Some of the N atoms would become incorporated into the film in place of the displaced carbon, while the H atoms would most combine with the displaced carbon to form stabilized hydrocarbons which are predominantly expelled from the reactor.

As an alternate preferred example, the component gas might consist of elemental Ar. The interaction for carbon removal in this and other examples may be chemical, physical or a combination of both. The plasma argon ions would bombard the deposited film and react or impinge upon unbonded and incomplete electron shell carbon atoms to effectively drive carbon from the film. Carbon remaining deeper within the film would then desirably outwardly defuse to be impinged upon by more Argon plasma, and be displaced from the film.

Further alternately, the construction of FIGS. 2 and 3 might be provided by a series of thin (i.e., 100 Angstroms) layers of discrete conductive layers with separate plasma treatments after deposition of one or more of such discrete layers.

Figure 4:
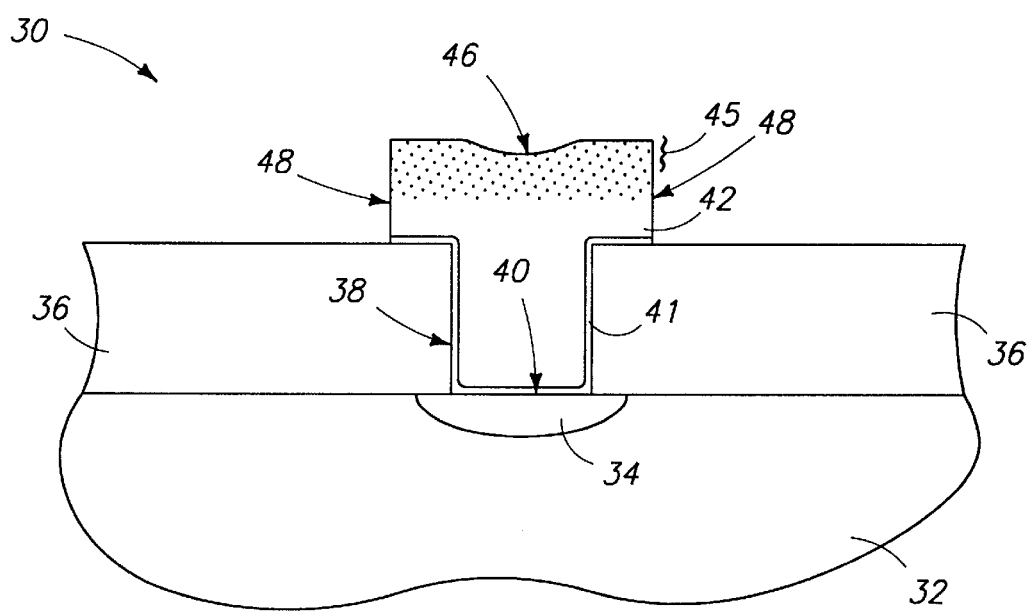
FIG. 4 is a view of the FIG. 2 wafer fragment at a processing step subsequent to that shown by FIG. 4.

Referring to FIG. 4, and after exposure to the first plasma, deposited layer 42 is patterned into a conductive line 46 which is integral with, and thereby an electrical connection with, material of layer 42 within contact opening 38. Such patterning defines and exposes opposing sidewalls 48 of electrically conductive material layer 42 above insulating layer 36. Where first plasma treatment was not effective to completely densify the thickness of layer 42, the lower portion of such sidewalls 48 beneath upper portion 45 are effectively undensified, and subject to undesired oxygen incorporation upon exposure to an oxygen containing ambient.

Figure 5:
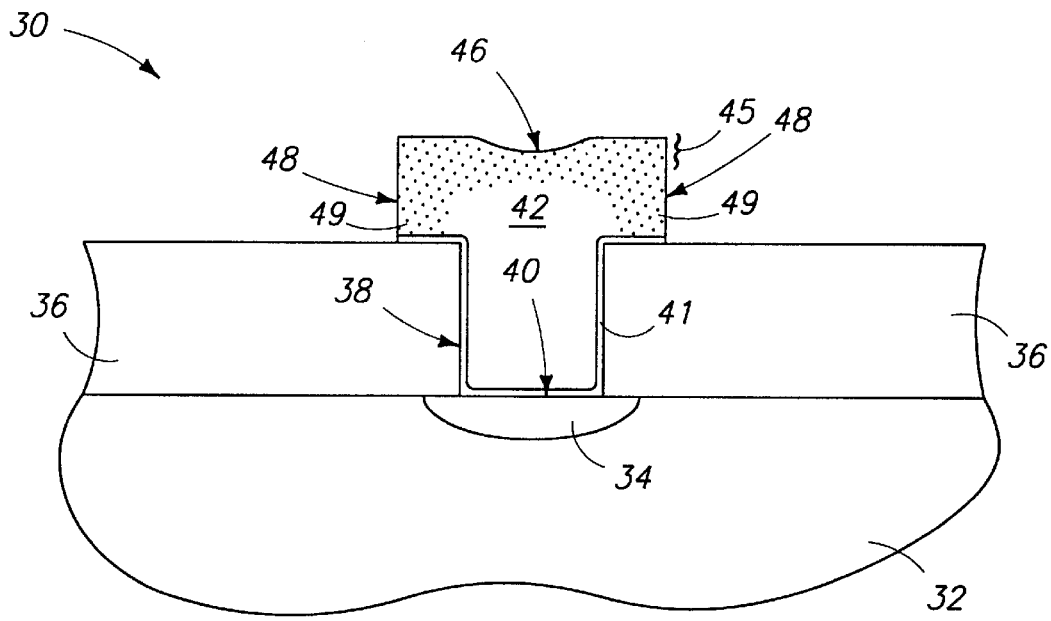
FIG. 5 is a view of the FIG. 2 wafer fragment at a processing step subsequent to that shown by FIG. 4.

Accordingly, and with reference to FIG. 5, the substrate with conductive line 46 is provided within a suitable reactor and subjected to a second plasma treatment, with such being effective to densify outermost exposed portions 49 of sidewalls 48 to render such sidewalls less capable of absorbing oxygen when exposed to an oxygen containing ambient. The preferred plasma treatment is identical to that described above, or can alternately be modified utilizing different gas(es) for plasma generation. Most preferably, there is no intervening exposure of conductive line 46, and its unprotected sidewalls 48, to an oxygen containing ambient between the step of patterning to form line 46 and the second plasma exposure to produce densified regions 49. Further where all processing to produce line 46 were conducted in an entirely inert environment with no intervening exposure to oxygen, plasma treatment can be delayed to a single plasma treatment after formation of line 46 which will effectively in a single plasma treatment step densify at least the top and sidewall portions of patterned line 46.

Figure 6:
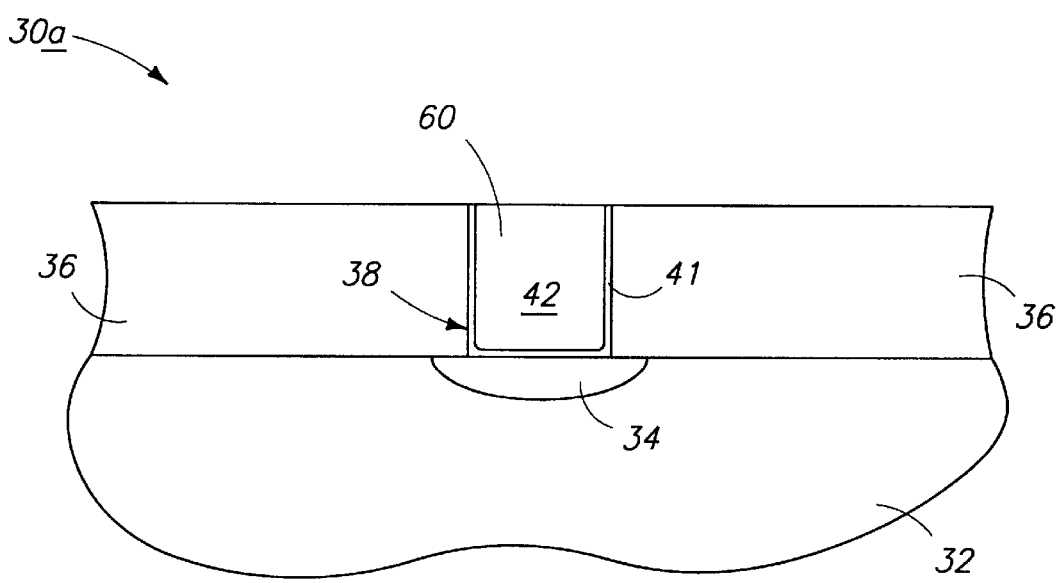
FIG. 6 is a diagrammatic sectional view of an alternate embodiment semiconductor wafer fragment at one alternate processing step in accordance with the invention.

Another alternate embodiment is described with reference to FIGS. 6 and 7. Like numerals from the first described embodiment are utilized where appropriate, with differences being indicated by the suffixes "a" or with different numerals. FIG. 6 illustrates a processing step which in one embodiment is conducted immediately subsequent to the processing to produce the FIG. 3 construction. In FIG. 6, layer 42 is planarize etch (i.e., etched-back or chemical-mechanical polished) back to insulating layer 36 effective to define or form an isolated electrically conductive plug 60 of conductive material of layer 42 within contact opening 38.

Figure 7:
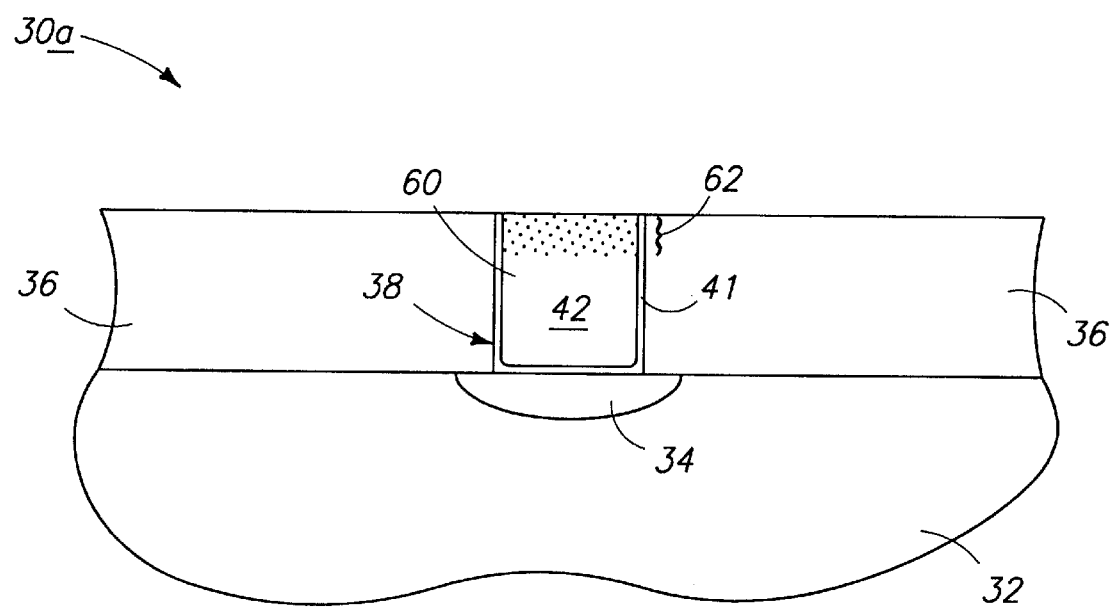
FIG. 7 is a view of the FIG. 6 wafer fragment at a processing step subsequent to that shown by FIG. 6.

Referring to FIG. 7, the FIG. 6 substrate has been placed within a reactor and subjected to the above described plasma treatment to densify at least an outermost portion 62 of plug 60, to render such portion and the plug thereby less capable of absorbing oxygen when exposed to an oxygen containing ambient. Processing in the above described manner enables exposure of the substrate to an oxygen containing ambient between the first and second plasma exposures due to the first plasma treatment without risk of appreciatively lower conductivity of layer 42 which would otherwise exist without such plasma treatment. Regardless, preferably there is no intervening exposure of electrically conductive layer 42 to an oxygen containing ambient between the planarize etching step and the second plasma exposure.

Further alternatively, all processing might be conducted within an in situ, inert environment such that there is never any exposure of the material of layer 42 to an oxygen containing ambient during processing. In such instance, only a single plasma treatment might be utilized at the end to produce the FIG. 7 construction, which would occur after the planarized etching. Accordingly in such example, there would be no exposure of the electrically conductive material of layer 42 to a plasma environment prior to some provision or definition of isolated electrically conductive plug 60.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of making electrical contact to a node comprising the following steps:

forming an insulating layer relative to a substrate to which electrical connection is to be made;

forming a contact opening in the insulating layer to the substrate;

forming a layer of electrically conductive material to substantially fill the contact opening; the electrically conductive material being undesirably capable of absorbing oxygen, when exposed to an oxygen containing ambient, effective to render such material less electrically conductive; and providing the substrate with the provided layer of electrically conductive material within a reactor, injecting a gas into the reactor and generating a plasma from the gas against the material and exposing the material to the plasma to densify at least an outermost exposed portion of such material and render the layer of material less capable of absorbing oxygen when exposed to an oxygen containing ambient.

2. The semiconductor processing method of claim 1 wherein the electrically conductive material predominately comprises TiN.

3. The semiconductor processing method of claim 1 wherein the electrically conductive material comprises titanium, carbon, and nitrogen.

4. The semiconductor processing method of claim 1 wherein the electrically conductive material layer as-provided comprises carbon, the gas and plasma generated therefrom having a component which is effective when in an activated state to interact with a component of the conductive layer to remove carbon therefrom.

5. The semiconductor processing method of claim 1 wherein the electrically conductive material layer as-provided comprises hydrocarbon, the gas and plasma generated therefrom having a component which is effective when in an activated state to interact with a component of the conductive layer to remove hydrocarbon therefrom.

6. The semiconductor processing method of claim 1 wherein,
the electrically conductive material predominately comprises TiN; and
the electrically conductive material layer as-provided comprises carbon, the gas and plasma generated therefrom having a component which is effective when in an activated state to interact with a component of the conductive layer to remove carbon therefrom.

7. The semiconductor processing method of claim 1 wherein the plasma exposure densifies only an outer exposed 100 Angstroms to 500 Angstroms of the material.

8. The semiconductor processing method of claim 1 wherein the electrically conductive material comprises titanium and nitrogen, and wherein the gas comprises one or more gases selected from the group consisting of $N_2$, Ar, $H_2$, and $NH_3$.

9. A semiconductor processing method of making electrical contact to a node comprising the following steps:
forming an insulating layer relative to a substrate to which electrical connection is to be made;
forming a contact opening in the insulating layer to the substrate;
depositing a layer of electrically conductive material to a thickness effective for patterning of a conductive line over the insulating layer and within the contact opening to substantially fill the contact opening; the electrically conductive material being undesirably capable of absorbing oxygen, when exposed to an oxygen containing ambient;
providing the substrate with the deposited layer of electrically conductive material within a reactor, injecting a gas into the reactor, generating a first plasma from the gas against the material, and exposing the material to the first plasma to densify at least an outermost exposed portion of such material and render the layer of material less capable of absorbing oxygen when exposed to an oxygen containing ambient;
patterning the deposited layer into a conductive line which is in electrical connection with the material within the contact opening to expose sidewalls of the electrically conductive material above the insulating layer; and
providing the substrate with the conductive line of the electrically conductive material within a reactor, injecting a gas into the reactor, generating a second plasma from the gas against the material of the line and exposing the line sidewall material to the second plasma to densify at least an outermost exposed portion of such sidewall material and render the sidewalls less capable of absorbing oxygen when exposed to an oxygen containing ambient.

10. The semiconductor processing method of claim 9 wherein the electrically conductive material predominately comprises TiN.

11. The semiconductor processing method of claim 9 wherein the electrically conductive material comprises titanium, carbon, and nitrogen.

12. The semiconductor processing method of claim 9 wherein the electrically conductive material layer as-deposited comprises carbon, the gas and plasma generated therefrom in the first and second plasma exposures having a respective component which is effective when in an activated state to interact with a component of the deposited conductive layer to remove carbon therefrom.

13. The semiconductor processing method of claim 9 wherein the electrically conductive material layer as-provided comprises hydrocarbon, the gas and plasma generated therefrom having a component which is effective when in an activated state to interact with a component of the conductive layer to remove hydrocarbon therefrom.

14. The semiconductor processing method of claim 9 wherein,
the electrically conductive material predominately comprises TiN; and
the electrically conductive material layer as-deposited comprises carbon, the gas and plasma generated therefrom in the first an second plasma exposures having a respective component which is effective when in an activated state to interact with a component of the deposited conductive layer to remove carbon therefrom.

15. The semiconductor processing method of claim 9 wherein the first and second plasma exposures densifies only an outer exposed 100 Angstroms to 500 Angstroms of the material.

16. The semiconductor processing method of claim 9 wherein there is no intervening exposure of the conductive line to an oxygen containing ambient between the patterning step and the second plasma exposure.

17. The semiconductor processing method of claim 9 wherein the injected gases utilized in the first and the second plasma exposures constitute the same gas.

18. The semiconductor processing method of claim 9 wherein the electrically conductive material comprises titanium and nitrogen, and wherein the gas comprises one or more gases selected from the group consisting of $N_2$, Ar, $H_2$, and $NH_3$.

19. A semiconductor processing method of making electrical contact to a node comprising the following steps:
forming an insulating layer relative to a substrate to which electrical connection is to be made;
forming a contact opening in the insulating layer to the substrate;
depositing a layer of electrically conductive material over the insulating layer and within the contact opening to substantially fill the contact opening; the electrically conductive material being undesirably capable of absorbing oxygen when exposed to an oxygen containing ambient;
providing the substrate with the deposited layer of electrically conductive material within a reactor, injecting a gas into the reactor and generating a first plasma from the gas against the material, and exposing the material to the first plasma to densify at least an outermost exposed portion of such material and render the layer of material less capable of absorbing oxygen when exposed to an oxygen containing ambient;
after exposure to the first plasma, planarizing the conductive material layer to the insulating layer to define an isolated conductive plug of the conductive material within the contact opening; and
providing the substrate with the isolated conductive plug within a reactor, injecting a gas into the reactor and generating a second plasma from the gas against an outermost exposed portion of the conductive plug, and exposing the outermost portion of the plug to the second plasma to densify at least said outermost exposed portion of the plug and render the plug material less capable of absorbing oxygen when exposed to an oxygen containing ambient.

20. The semiconductor processing method of claim 19 wherein the electrically conductive material predominately comprises TiN.

21. The semiconductor processing method of claim 19 wherein the electrically conductive material comprises titanium, carbon, and nitrogen.

22. The semiconductor processing method of claim 19 wherein the electrically conductive material layer as-deposited comprises carbon, the gas and plasma generated therefrom in the first and second plasma exposures having a respective component which is effective when in an activated state to interact with a component of the deposited conductive layer to remove carbon therefrom.

23. The semiconductor processing method of claim 19 wherein the electrically conductive material layer as-provided comprises hydrocarbon, the gas and plasma generated therefrom having a component which is effective when in an activated state to interact with a component of the conductive layer to remove hydrocarbon therefrom.

24. The semiconductor processing method of claim 19 wherein, the electrically conductive material predominately comprises TiN; and the electrically conductive material layer as-deposited comprises carbon, the gas and plasma generated therefrom in the first an second plasma exposures having a respective component which is effective when in an activated state to interact with a component of the deposited conductive layer to remove carbon therefrom.

25. The semiconductor processing method of claim 19 wherein the first and second plasma exposures densifies only an outer exposed 100 Angstroms to 500 Angstroms of the material.

26. The semiconductor processing method of claim 19 wherein the injected gases utilized in the first and the second plasma exposures constitute the same gas.

27. The semiconductor processing method of claim 19 comprising exposing the electrically conductive material to an oxygen containing ambient between the first and second plasma exposures.

28. The semiconductor processing method of claim 19 wherein there is no intervening exposure of the electrically conductive material to an oxygen containing ambient between the planarize etching step and the second plasma exposure.

29. The semiconductor processing method of claim 19 comprising exposing the electrically conductive material to an oxygen containing ambient between the first and second plasma exposures, and wherein there is no intervening exposure of the electrically conductive material to an oxygen containing ambient between the planarize etching step and the second plasma exposure.

30. The semiconductor processing method of claim 19 wherein the electrically conductive material comprises titanium and nitrogen, and wherein the gas comprises one or more gases selected from the group consisting of $N_2$, Ar, $H_2$, and $NH_3$.

31. A semiconductor processing method of making electrical contact to a node comprising the following steps:

forming an insulating layer relative to a substrate to which electrical connection is to be made;

forming a contact opening in the insulating layer to substrate;

depositing a layer of electrically conductive material over the insulating layer and within the contact opening to substantially fill the contact opening; the electrically conductive material being undesirably capable of absorbing oxygen when exposed to an oxygen containing ambient;

planarizing the conductive material layer to the insulating layer to define an isolated conductive plug of the conductive material within the contact opening; and providing the substrate with the isolated conductive plug within a reactor, injecting a gas into the reactor and generating a plasma from the gas against an outermost exposed portion of the conductive plug, and exposing the outermost portion of the plug to the plasma to densify at least said outermost exposed portion of the plug and render the plug material less capable of absorbing oxygen when exposed to an oxygen containing ambient.

32. The semiconductor processing method of claim 31 wherein the electrically conductive material predominately comprises TiN.

33. The semiconductor processing method of claim 31 wherein the electrically conductive material comprises titanium, carbon, and nitrogen.

34. The semiconductor processing method of claim 31 wherein the electrically conductive material layer as-deposited comprises carbon, the gas and plasma generated therefrom having a component which is effective when in an activated state to interact with a component of the deposited conductive layer to remove carbon therefrom.

35. The semiconductor processing method of claim 31 wherein the electrically conductive material layer as-provided comprises hydrocarbon, the gas and plasma generated therefrom having a component which is effective when in an activated state to interact with a component of the conductive layer to remove hydrocarbon therefrom.

36. The semiconductor processing method of claim 31 wherein, the electrically conductive material predominately comprises TiN; and the electrically conductive material layer as-deposited comprises carbon, the gas and plasma generated therefrom having a component which is effective when in an activated state to interact with a component of the deposited conductive layer to remove carbon therefrom.

37. The semiconductor processing method of claim 31 wherein the plasma exposure densities only an outer exposed 100 Angstroms to 500 Angstroms of the material.

38. The semiconductor processing method of claim 31 wherein there is no exposure of the electrically conductive material to a plasma environment prior to provision of the isolated electrically conductive plug.

39. The semiconductor processing method of claim 31 wherein the electrically conductive material comprises titanium and nitrogen, and wherein the gas comprises one or more gases selected from the group consisting of $N_2$, Ar, $H_2$, and $NH_3$.

* * * * *

UNITED STATES PATENT AND TRADEMARK OFFICE
CERTIFICATE OF CORRECTION

PATENT NO.    : 5,773,363
DATED         : June 30, 1998
INVENTOR(S)   : Garo J. Derderian et al.

It is certified that error appears in the above-identified patent and that said Letters Patent is hereby corrected as shown below:

Col. 6, l. 15:   Replace "include.," with --include--.

Col. 10, l. 13:  Replace "an" with --and--.

Col. 11, l. 26:  Replace "an" with --and--.

Col. 12, l. 51:  Replace "densities" with --densifies--.

Signed and Sealed this

Twenty-ninth Day of September, 1998

Attest:

BRUCE LEHMAN

Attesting Officer      Commissioner of Patents and Trademarks